United States Patent
Kobayashi

(10) Patent No.: US 6,332,016 B1
(45) Date of Patent: *Dec. 18, 2001

(54) PHOTOELECTRIC CONVERSION DEVICE, MANUFACTURING METHOD THEREOF, AND X-RAY IMAGING SYSTEM INCLUDING THE DEVICE

(75) Inventor: Isao Kobayashi, Atsugi (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/362,050

(22) Filed: Jul. 28, 1999

(30) Foreign Application Priority Data

Jul. 30, 1998 (JP) .................................. 10-215853

(51) Int. Cl.[7] ...................................................... H05G 1/64
(52) U.S. Cl. .......................... 378/98.2; 378/41; 250/214; 427/567
(58) Field of Search ..................... 378/98.2, 41; 250/214, 250/208.1, 370.09, 370.11; 427/567

(56) References Cited

U.S. PATENT DOCUMENTS

| | | | |
|---|---|---|---|
| 4,607,168 | * | 8/1986 | Oritsuki et al. . |
| 4,724,157 | * | 2/1988 | Toda et al. . |
| 5,138,467 | | 8/1992 | Saika et al. ............................ 358/482 |
| 5,793,047 | | 8/1998 | Kobayashi et al. ............. 250/370.09 |
| 5,801,385 | | 9/1998 | Endo et al. ...................... 250/370.11 |

FOREIGN PATENT DOCUMENTS 8-116044    5/1996  (JP) .

* cited by examiner

Primary Examiner—Robert H. Kim
Assistant Examiner—Pamela R. Hobden
(74) Attorney, Agent, or Firm—Fitzpatrick, Cella, Harper & Scinto

(57) ABSTRACT

In order to provide a photoelectric conversion device of high S/N ratio or high resolution in which the outputs of sensor cells except any defective sensor cell can be made to have normal values, thereby to obtain data of higher precision, any switching element that does not operate normally is removed in a photoelectric conversion device wherein a plurality of sensor cells, in each of which a photoelectric element and a switching element are connected, are arrayed in two dimensions on a substrate.

10 Claims, 14 Drawing Sheets

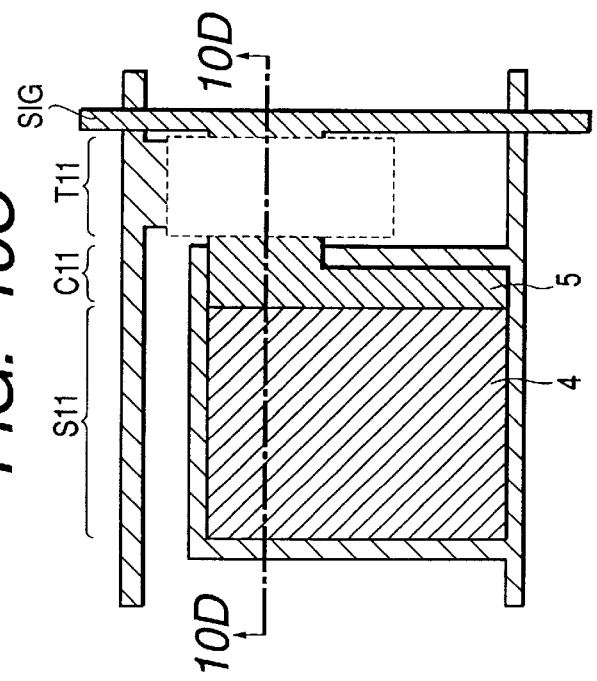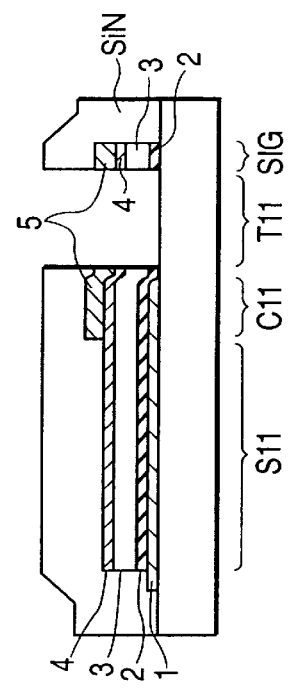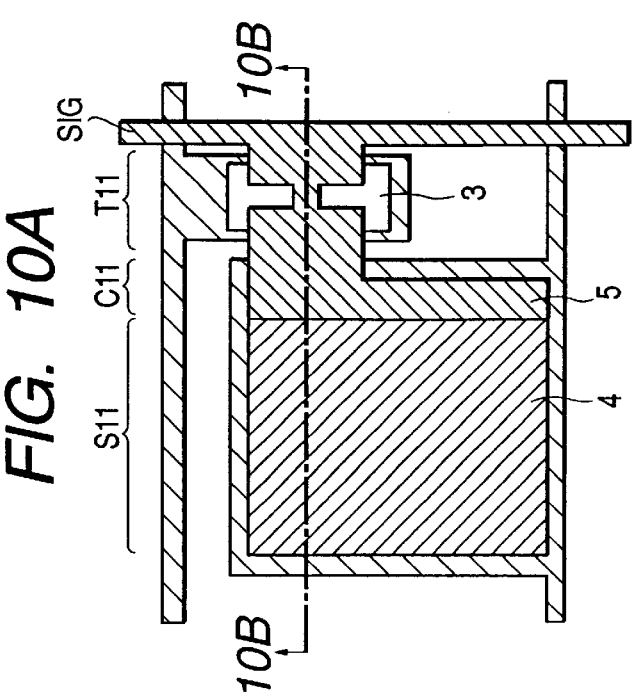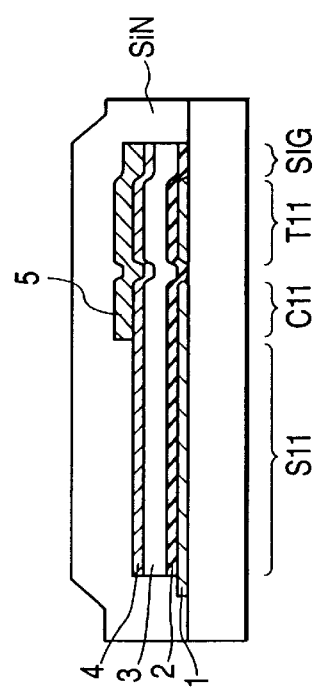

PHOTOELECTRIC CONVERSION DEVICE, MANUFACTURING METHOD THEREOF, AND X-RAY IMAGING SYSTEM INCLUDING THE DEVICE

BACKGROUND OF THE INVENTION

1. Field of the Invention

The present invention relates to a photoelectric conversion device, a method of manufacturing the device, and an X-ray imaging system including the device. More particularly, it relates to a photoelectric conversion device wherein a plurality of sensor cells, in each of which a photoelectric element and a switching element are connected, are arrayed in two dimensions on a substrate, a method of manufacturing the device, and an X-ray imaging system including the device.

Also, the present invention is well suited for applications to a photoelectric conversion device which has photoelectric elements arrayed in two dimensions for actual-size reading in, for example, a facsimile equipment, a digital copier or an X-ray imaging apparatus, and to a method of repairing the photoelectric conversion device.

Further, the present invention pertains to an X-ray imaging system in which the above photoelectric conversion device having the photoelectric elements of two-dimensional arrayal is assembled.

2. Related Background Art

Heretofore, a reading system which is configured of a scaling-down optical system and a CCD (charge-coupled device) type sensor has been employed as the reading system of a facsimile equipment, a digital copier, an X-ray imaging apparatus or the like. In recent years, however, photoelectric semiconductor materials typified by hydrogenated amorphous silicon (hereinbelow, expressed as "a-Si") have been being developed. This has resulted in the remarkable developments of so-called "close contact type sensors" in each of which photoelectric elements and a signal processing portion are formed on a substrate of large area so as to adopt an optical system for the actual-size reading of an information source.

In particular, the a-Si is usable, not only as the photoelectric material, but also as the material of thin-film field effect transistors (hereinbelow, simply expressed as "transistors"). Accordingly, it has the advantage that a semiconductor layer for photoelectric conversion and a semiconductor layer for the transistors can be formed at the same time.

An example of a photoelectric conversion device utilizing such a-Si is disclosed in the official gazette of Japanese Patent Application Laid-open No. 8-116044. It will now be explained with reference to FIG. 1 and FIGS. 2A and 2B of the accompanying drawings. FIG. 1 is a circuit diagram showing the whole circuit of the photoelectric conversion device. Besides, FIG. 2A is a schematic plan view of constituent elements which correspond to one sensor cell of the photoelectric conversion device. Further, FIG. 2B is a schematic sectional view taken along line 2B—2B indicated in FIG. 2A.

First, the construction of the photoelectric conversion device will be explained. Referring to FIG. 1, each sensor cell is configured of a photoelectric element S, a capacitor C and a transistor T. In the photoelectric conversion device, the sensor cells totaling nine (3×3) are divided into three blocks of respective columns. That is, one block consists of three sensor cells.

In the figure, symbols S11 to S33 denote the photoelectric elements S. The lower electrode side of each photoelectric element S is indicated by letter G, while the upper electrode side thereof is indicated by letter D. In addition, symbols C11 to C33 denote the capacitors for storage, and symbols T11 to T33 the transistors for transferring data.

Besides, symbol Vs designates a power source (or supply voltage) for reading out a converted charge signal, and symbol Vg a power source (or supply voltage) for refreshment. These power sources Vs and Vg are respectively connected to the G electrodes of all the photoelectric elements S11 to S33 through a switch SWs and a switch SWg. The switch SWs is connected to a refreshment control circuit RF through an inverter, while the switch SWg is connected thereto directly. The switch SWg is controlled so as to turn "ON" during a refreshing time period.

Further, a part enclosed with a broken line in FIG. 1 is formed on an identical insulated substrate of large area. In the enclosed part, the sensor cell having the photoelectric element S11 is illustrated as the plan view in FIG. 2A. Also, a plane along the dot-and-dash line 2B—2B indicated in FIG. 2A is illustrated as the sectional view in FIG. 2B.

Referring to FIG. 2B, the sensor cell generally shown in FIG. 2A includes a lower electrode 1 which forms a gate electrode on the insulating substrate, a gate insulator film 2, an i-layer 3 which is a semiconductor layer effecting photoelectric conversion, an n-layer 4 which hinders the injection of holes, and an upper electrode layer 5 which forms source and drain electrodes. This sensor cell is fabricated in such a way that the lower electrode layer 1, the gate insulator film 2, the i-layer 3, the n-layer 4, and the upper electrode layer 5 serving as the source and drain electrodes are first stacked in the order mentioned, that the upper electrode layer 5 is subsequently etched to form the source and drain electrodes, and that the n-layer 4 is thereafter etched to form a channel portion.

In the above photoelectric conversion device, the capacitor C11 and the photoelectric element S11 are disposed without special isolation. This is because the photoelectric element S11 and the capacitor C11 are configured of the same layers. Such a configuration is also the feature of the photoelectric conversion device. Besides, the capacitor C11 is formed while keeping the areas of the electrodes of the photoelectric element S11 large. The reason therefor is that, when the areas of the electrodes of the photoelectric element S11 are enlarged, the sensitivity of the sensor is enhanced, leading to decrease in the quantity of exposure to X-rays as is required for the photoelectric conversion device of, for example, the X-ray imaging apparatus.

In addition, a silicon nitride (SiN) film for passivation and a phosphor layer of cesium iodide (CsI) or the like are formed at the upper part of the sensor cell. When X-rays are caused to fall on the sensor cell, they are converted by the phosphor layer CsI into light or visible radiation (indicated by arrows of broken lines), which enters the photoelectric element S11.

Next, an example of the operation of the photoelectric conversion device will be explained. Referring also to FIG. 1, the output of the charge signal converted in each photoelectric element S is stored in the storage capacitor C. The stored signal is fetched on a signal wiring line SIG when the transistor T is turned "ON" by an output signal from a shift register SR1. The fetched charge signal is inputted to a detecting integrated circuit IC when a switch M is turned "ON" by a control signal delivered from a shift register SR2.

More concretely, electric signals outputted from the sensor cells of one block are simultaneously fetched on one signal wiring line SIG, and they are collectively transferred to the detecting integrated circuit IC by the shift register SR2. Each of the electric signals transferred to the detecting integrated circuit IC is amplified into an output voltage Vout by an amplifier Amp.

The operation of the photoelectric conversion device will now be detailed with reference to a timing chart illustrated in FIG. 3. First of all, a high level voltage Hi is applied to control wiring lines g1 to g3 and s1 to s3 by the shift registers SR1 and SR2, respectively. Then, the transistors T11 to T33 and the switches M1 to M3 are turned "ON" owing to the high level outputs Hi of the shift register SR2. Thus, the electrodes D of all the photoelectric elements S11 to S33 become a ground (GND) potential. This is because the input terminal of the integrating detector Amp is designed so as to have the GND potential.

A high level voltage Hi is outputted from the refreshment control circuit RF, thereby to turn "ON" the switch SWg. Thus, the electrodes G of all the photoelectric elements S11 to S33 are brought to a plus potential by the refreshing supply voltage Vg. Then, all the photoelectric elements S11 to S33 fall into a refreshment mode and are refreshed.

Subsequently, a low level voltage Lo is outputted from the refreshment control circuit RF, thereby to turn "ON" the switch SWs. Thus, the electrodes G of all the photoelectric elements S11 to S33 are brought to a minus potential by the reading supply voltage Vs. Then, all the photoelectric elements S11 to S33 fall into a photoelectric conversion mode, and the capacitors C11 to C33 are simultaneously initialized.

Under this state, a low level voltage Lo is applied to the control wiring lines g1 to g3 and s1 to s3 by the shift registers SR1 and SR2, respectively. Then, the switches M1 to M3 for the transistors T11 to T33 are turned "OFF". Besides, the electrodes D of all the photoelectric elements S11 to S33 become open DC (direct current)-wise, but their potentials are held by the corresponding capacitors C11 to C33.

Since, however, the X-rays are not caused to fall on the sensor at this point of time, the light does not enter any of the photoelectric elements S11 to S33. In consequence, a photocurrent does not flow through any of the photoelectric elements S11 to S33. Thereafter, when the X-rays are caused to emerge in pulse-like fashion, to pass through a subject such as human body and to fall on the phosphor layer CsI, they are converted into the light, which enters the individual photoelectric elements S11 to S33. The light contains information on the internal structure of the subject such as human body. The photocurrents based on the light are stored in the individual capacitors C11 to C33 as electric charges, which are retained even after the end of the fall of the X-rays on the sensor.

Subsequently, a control pulse of high level (high level voltage Hi) is impressed on the control wiring line g1 by the shift register SR1. Besides, control pulses of high level (high level voltage Hi) are successively impressed on the control wiring lines s1 to s3 by the shift register SR2. Thus, output voltages v1 to v3 each being the voltage Vout are successively delivered through the switches M1 to M3. Likewise, the remaining light signals (or photocurrents) are successively delivered by the control signals of high level or low level (high level voltage Hi or low level voltage Lo) produced from the shift registers SR1 and SR2. In this way, the two-dimensional information items on the internal structure of the human body or the like are derived as output voltages v1 to v9.

Incidentally, a static image can be obtained by the operation stated above. On the other hand, a dynamic image can be obtained by repeating such operations.

In the photoelectric conversion device exemplified here, the electrodes G of the photoelectric elements S are connected in common to a horizontal output line. Besides, the horizontal output line is controlled to the potentials of the refreshing power source Vg and reading power source Vs through the respective switches SWg and SWs. Therefore, all the photoelectric elements S11 to S33 can be simultaneously changed over between the refreshment mode and the photoelectric conversion mode. Accordingly, the optical output can be derived by one transistor T per sensor cell without executing any complicated control.

The photoelectric conversion device has been explained above in relation to the case of transferring and outputting the signals with the construction wherein the nine sensor cells are arranged into the (3×3) two-dimensional arrayal, and wherein one block is constituted by the three sensor cells. However, the aspect of performance of the photoelectric conversion device is not restricted to the foregoing construction, but by way of example, (5×5) sensor cells numbering five per mm in each of the vertical and horizontal directions of the device may well be arranged in two dimensions into an arrayal of (2000×2000) sensor cells. Thus, it is possible to fabricate an X-ray detector whose size is 40 cm×40 cm. When an X-ray imaging apparatus or the like is constructed by combining the X-ray detector with an X-ray generator instead of an X-ray film, it can be used for a roentgenological chest examination etc.

The roentgenological chest examination with the X-ray imaging apparatus is capable of instantly projecting its result on a CRT (cathode-ray tube), unlike such an examination using the X-ray film. Further, it is capable of converting the result of detection into an output meeting a special purpose, through the digitization of the detected result and the image processing of digital data with a computer by way of example.

Besides, the converted outputs can be saved or retained in a magneto-optic disk. Accordingly, an image in the past can be instantly searched for and outputted. Moreover, the sensitivity of the X-ray imaging apparatus is higher than that of the X-ray film, and a clear image can be obtained with feeble X-rays of less influence on the human body.

Meanwhile, in manufacturing the photoelectric conversion device as stated above, some of the sensor cells fail to normally function in not a few cases. By way of example, when an amorphous silicon layer is to be deposited on a substrate, dust etc. sometimes come to lie on the substrate, but it is difficult to completely eliminate such dust etc. More concretely, when minute motes having appeared during the manufacture, trash having fallen off from the wall of a thin-film depositing equipment, etc. come to lie on the substrate, the complete elimination thereof is difficult. Accordingly, wiring lines laid on an identical plane or wiring lines laid at different levels might short-circuit.

Next, the outputs of abnormal sensor cells ascribable to the practicable short-circuits of the wiring lines of the elements will be explained in conjunction with FIGS. 4 and 5. FIG. 4 illustrates a case where the transistor T11 is in the state in which the source electrode and drain electrode thereof have short-circuited. The state results from a situation where resist patterns for forming the source electrode and the drain electrode have been connected by minute trash or the like. FIG. 5 is a timing chart of the operation of the device in such a case.

Usually, the output charges of the photoelectric element S11 are continually generated during the irradiation of the sensor with light. Besides, the charges are stored in the storage capacitor C11. However, in the illustrated case where the source electrode and the drain electrode have short-circuited, the photoelectric element S11 becomes as if it were connected with the signal wiring line SIG by turning "ON" the transistor T11. Consequently, the quantity of charges to be stored in the storage capacitor C11 becomes about ⅓ of an ordinary value. Accordingly, when the output of the photoelectric element S11 (indicated at v1 in FIG. 5) is fetched, it decreases to about ⅓ in comparison with the output of the usual operation as seen from FIG. 5.

To the contrary, when the outputs of the photoelectric elements S21 and S31 (respectively indicated at v4 and v7 in FIG. 5) are fetched, each of them has about ⅓ of the ordinary value added thereto. As a result, each of the outputs v4 and v7 increases to about 4/3 in comparison with the output of the usual operation as seen from FIG. 5.

Next, there will be explained the operation of the device in the case where the source electrode and gate electrode of the transistor T22 have short-circuited as illustrated in FIG. 4. Minute trash or the like sometimes results in the short-circuit between the source electrode and the gate electrode, as in the foregoing case of the transistor T11.

In such a case, the transistor T22 becomes as if the signal wiring line SIG and the control wiring line g2 were connected therethrough. Accordingly, the control wiring line g2 at the moment at which the outputs of the photoelectric element S12 and those S22 and S32 (respectively indicated at v2 and at v5 and v8 in FIG. 5) are fetched, is held at a potential (in general, 0 V to 5 V) in the case of turning "OFF" the transistors T. Consequently, each of the outputs of the photoelectric elements S12, S22 and S32 (respective outputs v2, v5 and v8) decreases to a much smaller value in comparison with the output of the usual operation as seen from FIG. 5.

In the presence of the defective sensor cells as stated above, the number of the erroneous outputs needs to be lessened as far as possible. It has therefore been common practice that the signal wiring lines SIG connected with the defective sensor cells are partially vaporized away to disconnect by laser irradiation.

Such a countermeasure will be explained with reference to FIG. 6. This figure illustrates the state in which the signal wiring lines SIG connected with the defective sensor cell 11 (here, the "sensor cell 11" includes the elements S11, C11 and T11, and such terminology shall apply also to the ensuing explanation) and sensor cell 22 in FIG. 4 have been partially vaporized away to disconnect by the laser irradiation.

Square parts of broken lines depicted between the signal wiring lines SIG and the respective transistors T11 and T22 of the sensor cells 11 and 22 are those parts of the signal wiring lines SIG connected with the defective sensor cells which have been vaporized away to disconnect by the laser irradiation. Incidentally, the other parts of the sensor cells 11 and 22 are the same as shown in FIG. 4 and shall be omitted from explanation.

Here, a schematic plan view of the sensor cell 11 and the individual wiring lines is illustrated in FIG. 7A. Besides, a schematic sectional view taken along dot-and-dash line 7B—7B indicated in FIG. 7A is illustrated in FIG. 7B. Further, examples of the operation of the photoelectric conversion device in the case where the defective sensor cells 11 and 22 have been subjected to the treatment or repair shown in FIGS. 7A and 7B, will be explained with reference to a timing chart illustrated in FIG. 8. By the way, in FIGS. 7A and 7B, the transistor T11 is illustrated in the state in which the source electrode and the drain electrode short-circuit. Besides, as in the foregoing, a square part of broken line in FIG. 7A is that part of the signal wiring line SIG which has been vaporized away to disconnect by the laser irradiation.

FIG. 7B illustrates the sectional structure of a portion where the signal wiring line SIG has been disconnected. As seen from the figure, not only the part of the signal wiring line SIG, but also the passivating silicon nitride layer SiN overlying the signal wiring line SIG and the gate insulator film 2, i-layer 3 and n-layer 4 underlying the signal wiring line SIG have been partially vaporized away by the laser irradiation.

Even when the signal wiring line SIG connected with the defective sensor cell 11 has been vaporized away to disconnect by the laser irradiation, the output v1 of the photoelectric element S11 does not demonstrate the value in the usual operation. The output v1 of the photoelectric element S11, however, is prevented from being superposed by leakage. Accordingly, the outputs v4 and v7 of the respective photoelectric elements S21 and S31 become as shown in FIG. 8.

Likewise, the signal wiring line SIG connected with the defective sensor cell 22 has been vaporized away to disconnect by the laser irradiation. Even when the signal wiring line SIG connected with the defective sensor cell 22 has been vaporized away to disconnect by the laser irradiation, the output v5 of the photoelectric element S22 does not demonstrate the value in the usual operation.

However, the gate line signal of the transistor T22 of the sensor cell 22 is prevented from being superposed by leakage, similarly to the effect in the case where the sensor cell 11 has been treated. Accordingly, the outputs v2 and v8 of the respective photoelectric elements S12 and S32 become as shown in FIG. 8.

Therefore, the outputs Vout shown in FIG. 5 change into those Vout shown in FIG. 8 in the above way that the signal wiring lines SIG connected with the defective sensor cells are vaporized away to disconnect by the laser irradiation. More specifically, the outputs Vout shown in FIG. 8 have been improved so as to be normal except the outputs v1 and v5 of the respective defective sensor cells 11 and 22.

Nevertheless, diminishing the X-rays influential on the human body, even slightly, is required of the photoelectric conversion device which has the photoelectric elements arrayed in two dimensions for the actual-size reading in, for example, the X-ray imaging apparatus. It is also required to obtain data of higher precision.

In order to meet the requirements, an expedient in which the area of each photoelectric element is enlarged has been generally adopted. Since, however, semiconductor patterns have been made highly dense, signal wiring lines connected with sensor cells have been reduced in size. It is accordingly difficult that, as stated above, the signal wiring lines connected with the defective sensor cells are partially vaporized away to disconnect by the laser irradiation.

More specifically, in case of manufacturing the photoelectric conversion device of high S/N (signal-to-noise) ratio or high resolution, the signal wiring lines connected with the sensor cells are partially used for the photoelectric elements, and yet, they are reduced in size or removed. Therefore, it is sometimes impossible that the signal wiring lines connected with the defective sensor cells are partially vaporized away to disconnect by the laser irradiation. Accordingly, it is sometimes impossible that the outputs of the sensor cells except the defective ones are brought to the usual values.

SUMMARY OF THE INVENTION

In order to solve the above problem, the present invention has for its object to provide a photoelectric conversion device of high S/N ratio or high resolution in which the outputs of sensor cells except defective ones can be made normal values so as to obtain data of higher precision, a method of manufacturing the photoelectric conversion device, and an X-ray imaging system which includes the photoelectric conversion device.

It is an object of the present invention to provide a photoelectric conversion device wherein a plurality of sensor cells, in each of which a photoelectric element and a switching element are connected, are arrayed in two dimensions on a substrate, the switching element of at least one of the sensor cells having been removed.

It is another object of the present invention to provide a method of manufacturing a photoelectric conversion device wherein a plurality of sensor cells, in each of which a photoelectric element and a switching element are connected, are arrayed in two dimensions on a substrate, comprises the step of vaporizing away any of the switching elements that does not operate normally, by laser irradiation.

It is still another object of the present invention to provide an X-ray imaging system, comprises a photoelectric conversion device which includes a phosphor for converting inputted X-rays into light; signal processing means for processing a signal delivered from said photoelectric conversion device; recording means for recording a signal delivered from said signal processing means; displaying means for displaying the signal delivered from said signal processing means; transmission processing means for transmitting said signal delivered from said signal processing means; and an X-ray source which generates the X-rays; said photoelectric conversion device including a plurality of sensor cells in each of which a photoelectric element and a switching element are connected, which are arrayed in two dimensions on a substrate, and in at least one of which the switching element has been removed.

It is still another object of the present invention to provide a method of manufacturing a photoelectric conversion device wherein a plurality of sensor cells, each of which has a photoelectric element and a switching element, are arrayed on a substrate, comprises the step of selecting any defective cell from among the sensor cells, and thereafter removing the switching element of the defective cell.

According to the present invention, the defective transistor (switching element) itself is removed by the laser beam irradiation or the like, so that a reliable treatment or repair can be carried out in spite of the smaller size of each sensor cell. Moreover, since the transistor itself is removed, a desired part can be electrically cut with a high reliability.

Further, according to the present invention, an erroneous output ascribable to the defective cell can be prevented from affecting any other cell thereby to obtain a preciser output signal.

BRIEF DESCRIPTION OF THE DRAWINGS

FIGS. 10A and 10B are a schematic plan view and a schematic sectional view showing examples of the constituent elements of the photoelectric conversion device shown in FIG. 9, respectively, while FIGS. 10C and 10D are a schematic plan view and a schematic sectional view showing the repaired state of the photoelectric conversion device, respectively;

DETAILED DESCRIPTION OF THE PREFERRED EMBODIMENTS

EMBODIMENT 1

Figure 9:
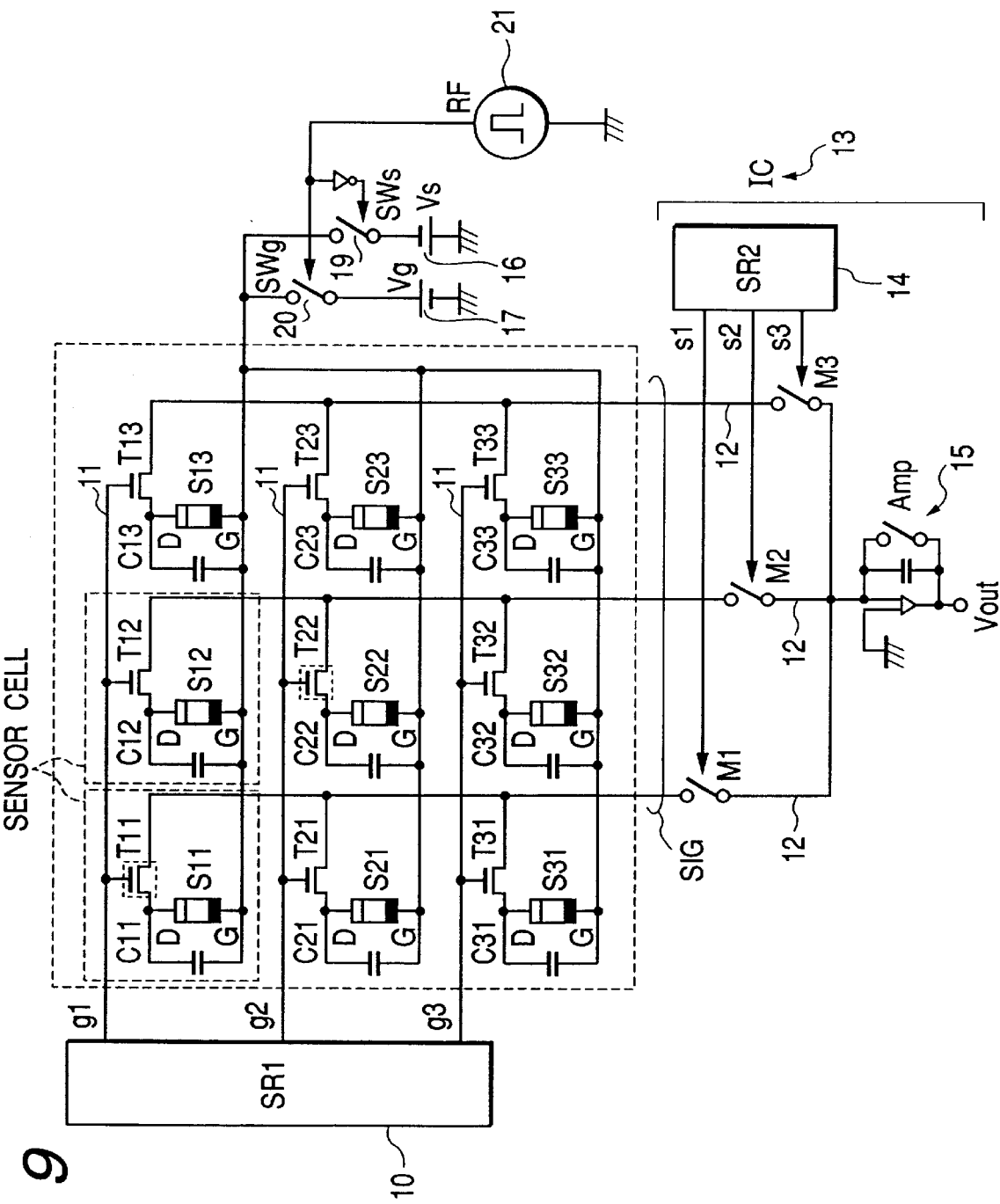
FIG. 9 is a circuit diagram showing an example of the whole circuit of a photoelectric conversion device.

Now, an embodiment of the present invention will be described in detail with reference to the drawings. FIG. 9 is a schematic circuit diagram showing the whole circuit of an example of a photoelectric conversion device in this embodiment. Referring to FIG. 9, each sensor cell is configured of a photoelectric element S, a capacitor C and a transistor (for example, a thin-film transistor) T. In the photoelectric conversion device, the sensor cells totaling nine (3×3) are divided into three blocks of respective columns. That is, one block consists of three sensor cells. In the figure, symbols S11 to S33 denote the photoelectric elements S. The lower electrode side of each photoelectric element S is indicated by letter G, while the upper electrode side thereof is indicated by letter D. In addition, symbols C11 to C33 denote the capacitors for storage, and symbols T11 to T33 the transistors for transferring data.

Further, the photoelectric conversion device includes a shift register (SR1) 10 which turns "ON"/"OFF" the transistors T, control wiring lines 11 by which control signals outputted from the shift register (SR1) 10 are delivered to the transistors T, signal wiring lines (SIG) 12 on which electric signals stored in the capacitors C are fetched, and a detecting integrated circuit (IC) 13 which has a shift register (SR2) 14 for fetching the electric signals and an amplifier (Amp) 15 for amplifying and delivering an output voltage Vout.

Besides, symbol Vs designates a power source (or supply voltage) 16 for reading out a converted charge signal, and symbol Vg a power source (or supply voltage) 17 for refreshment. These power sources Vs and Vg are respectively connected to the G electrodes of all the photoelectric elements S11 to S33 through a switch (SWs) 19 and a switch (SWg) 20. The switch (SWs) 19 is connected to a refreshment control circuit (RF) 21 through an inverter, while the switch (SWg) 20 is connected thereto directly.

Figure 1:
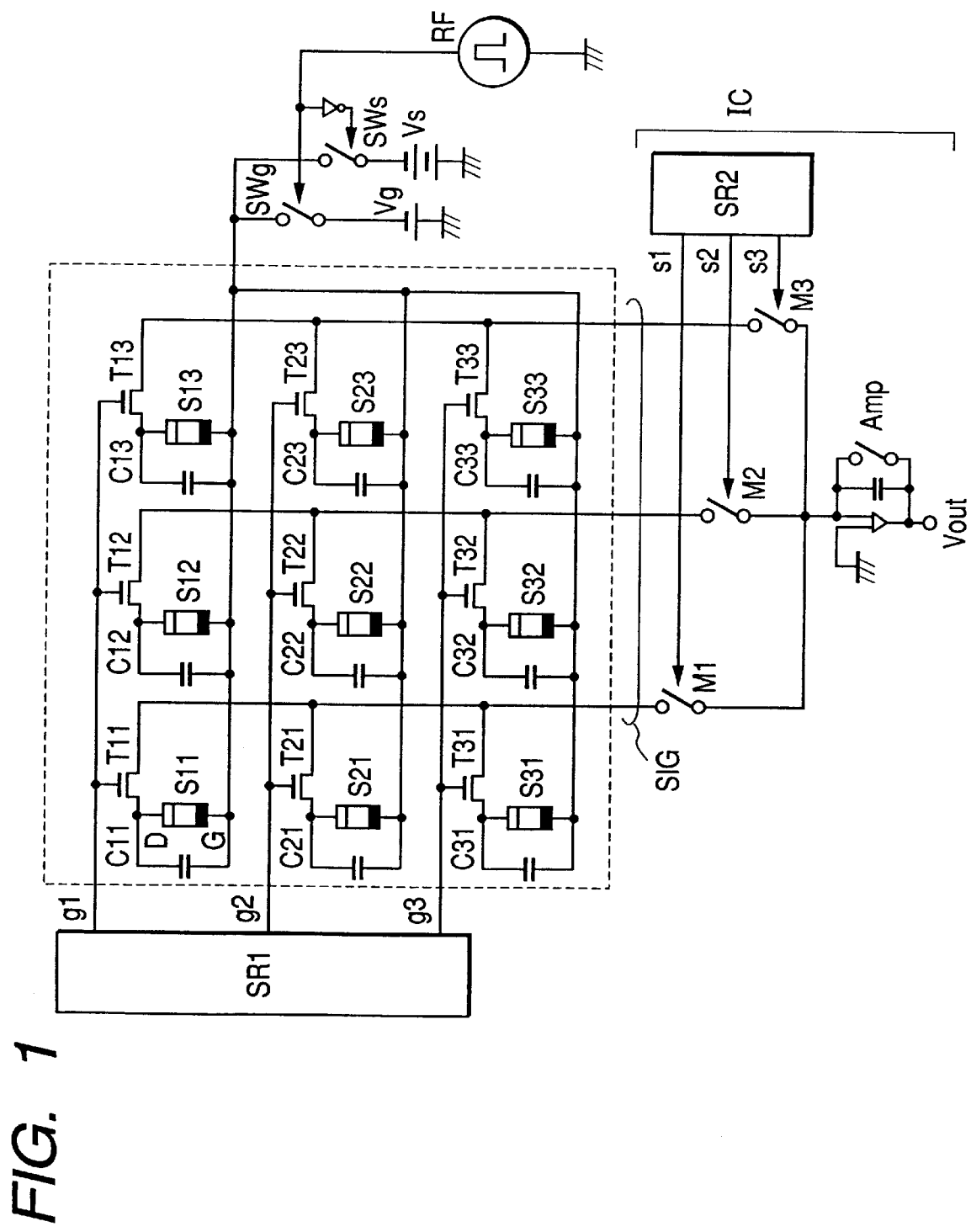
FIG. 1 is a circuit diagram showing an example of the whole circuit which is included in a photoelectric conversion device.
Figure 2A:
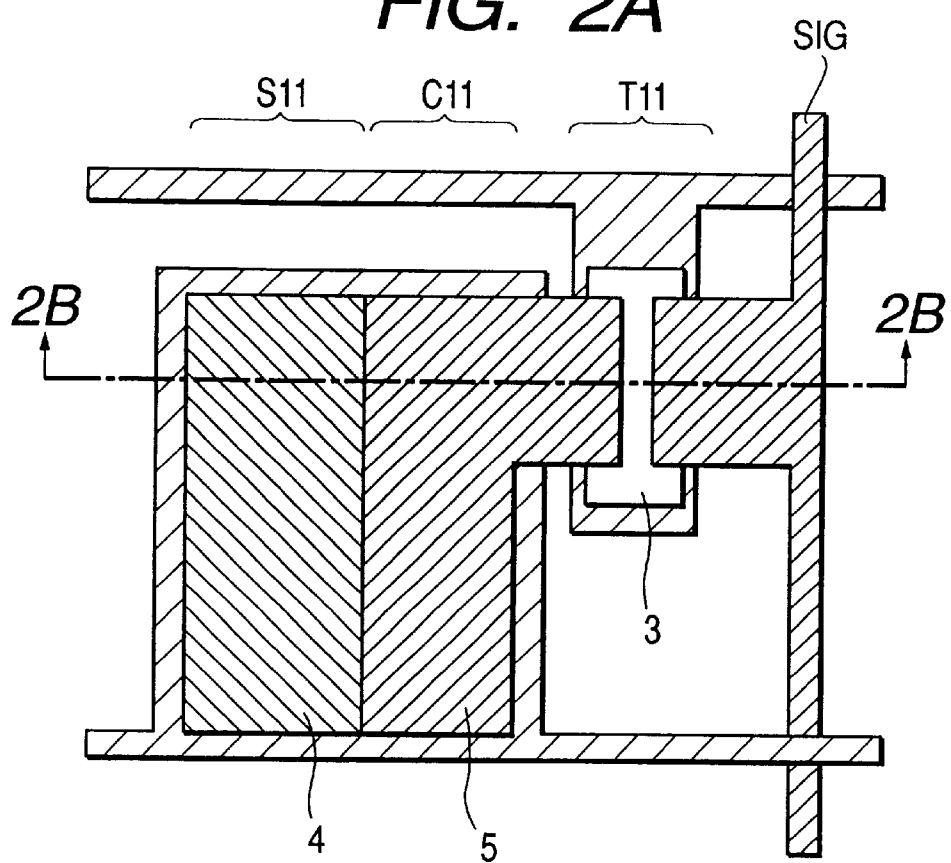
FIGS. 2A and 2B are a schematic plan view and a schematic sectional view showing examples of constituent elements which are included in the photoelectric conversion device, respectively.
Figure 2B:
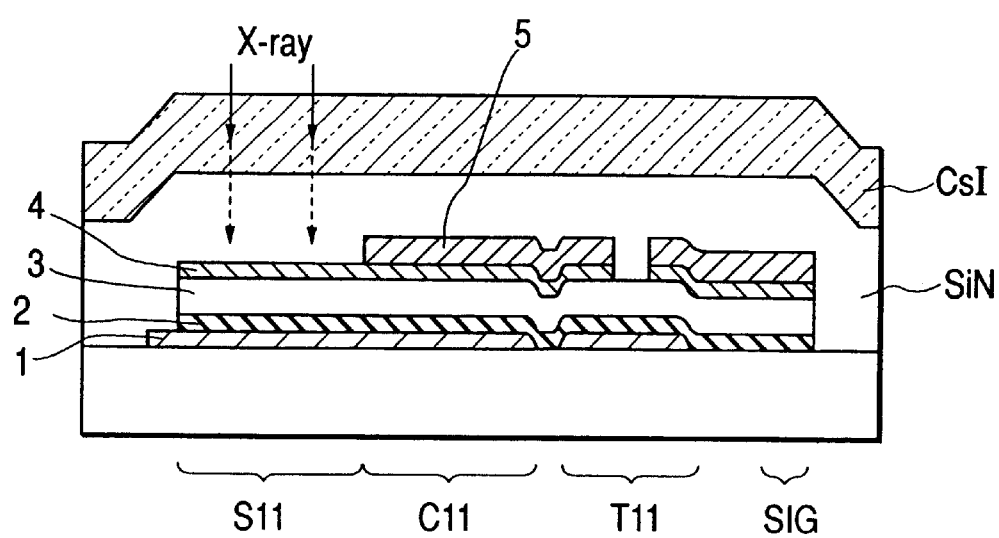
Figure 3:
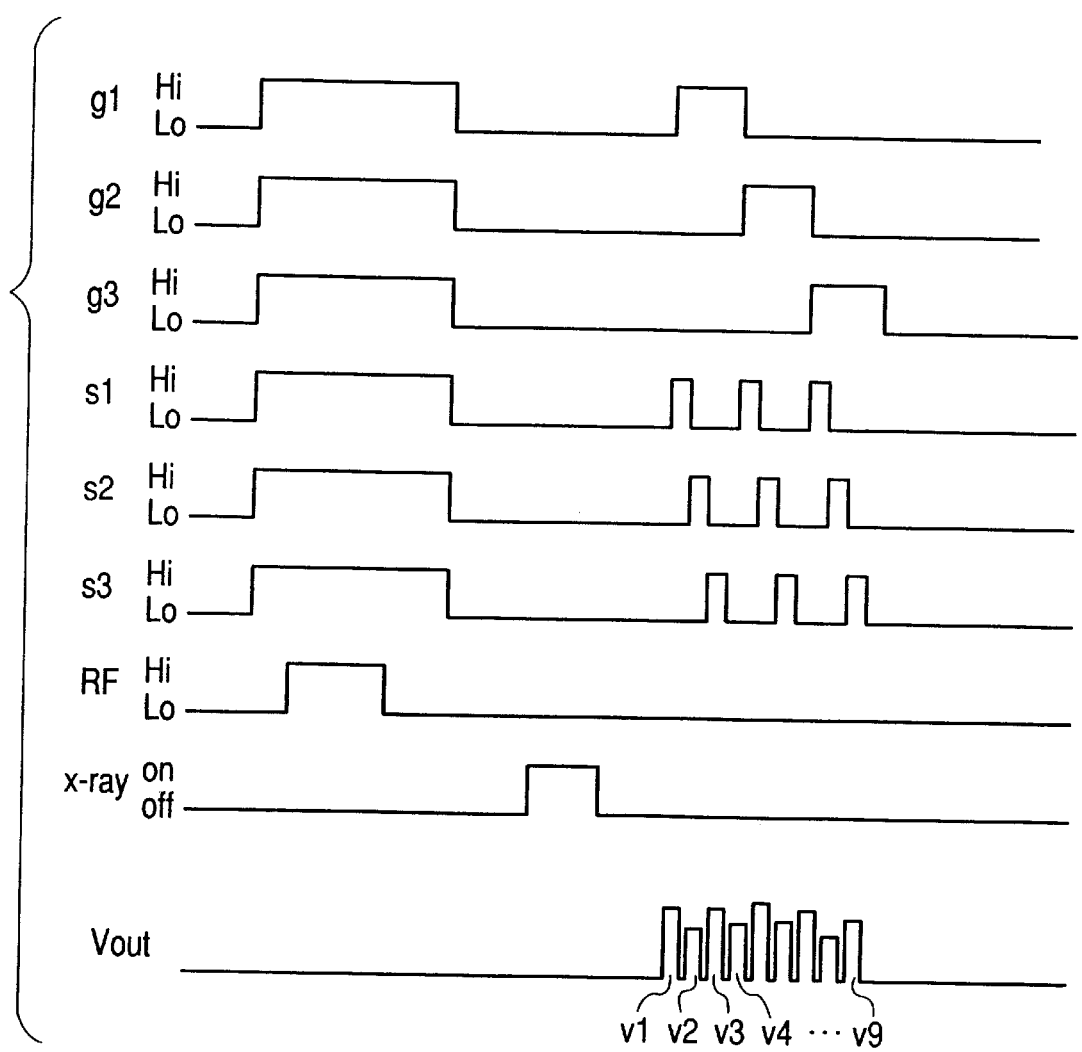
FIG. 3 is a timing chart showing an example of the operation of the photoelectric conversion device.
Figure 4:
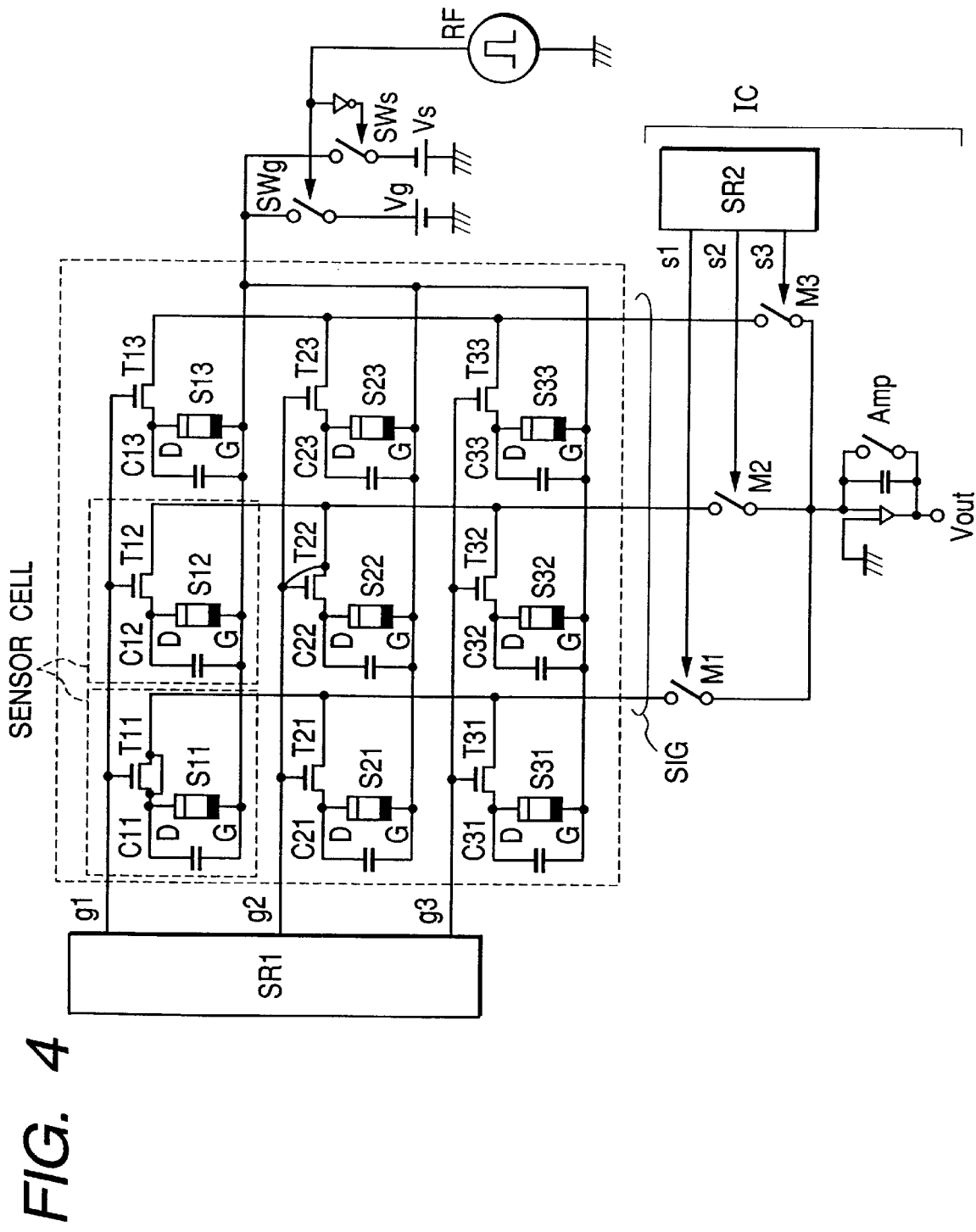
FIG. 4 is a circuit diagram of the whole circuit for explaining examples of defective elements which are sometimes included in the photoelectric conversion device shown in FIG. 1.
Figure 6:
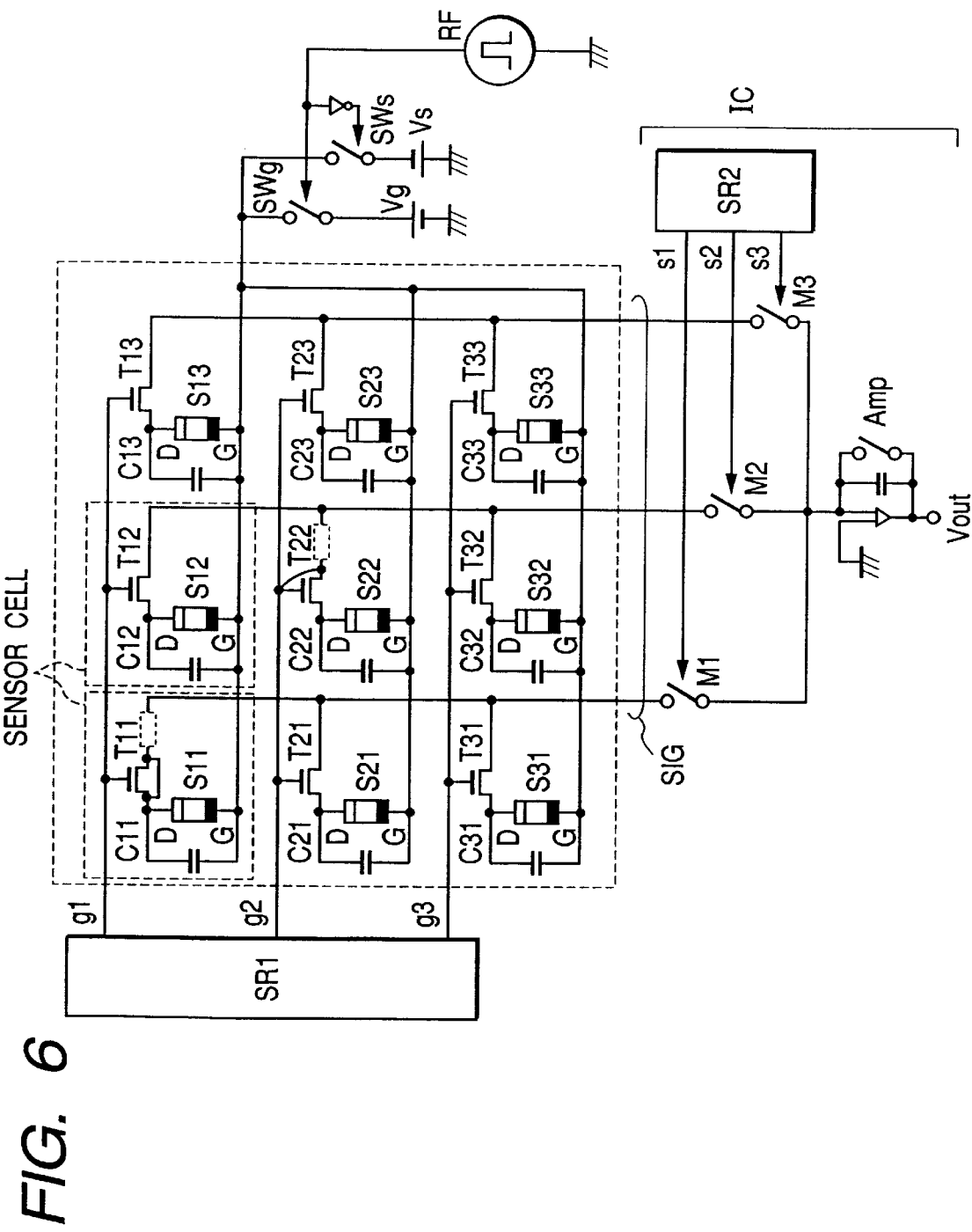
FIG. 6 is a circuit diagram of the whole circuit for explaining an example in the case where wiring portions have been vaporized away in the photoelectric conversion device shown in FIG. 4.

Incidentally, portions of the same functions as in FIGS. 1, 4 and 6 referred to before have the same symbols assigned thereto and shall not be repeatedly explained.

Next, the operation of the photoelectric conversion device in this embodiment will be described. The output of the electric signal converted in the photoelectric element S which is included in each sensor cell operating normally, is stored in the storage capacitor C. The stored signal is fetched on the signal wiring line (SIG) 12 when the transistor T is turned "ON" by the output signal from the shift register (SR1) 11. The fetched charges are inputted to the detecting integrated circuit (IC) 13 when a switch M (any of M1 to M3) is turned "ON" by a control signal delivered from the shift register (SR2) 14.

More concretely, the electric signals outputted from the sensor cells of one block are simultaneously fetched on one signal wiring line (SIG) 12, and they are collectively transferred to the detecting integrated circuit (IC) 13 by the shift register (SR2) 14. Each of the electric signals transferred to the detecting integrated circuit (IC) 13 is delivered as the output voltage Vout by the amplifier (Amp) 15.

Meanwhile, the sensor cells which do not operate normally are treated or repaired as explained below. It is assumed here that the transistor T11 in the sensor cell 11 failing to operate normally has had its source electrode and drain electrode short-circuited as illustrated in FIG. 4 referred to before. It is also assumed that the transistor T22 in the sensor cell 22 has had its source electrode and gate electrode short-circuited as in the foregoing. In the photoelectric conversion device shown in FIG. 9, square parts of broken lines existing at the positions of the respective transistors T11 and T22 of the sensor cells 11 and 22 are pattern circuit parts which have been vaporized away and removed by laser irradiation as illustrated in FIG. 6.

Next, the sensor cells not operating normally and the respective wiring lines will be explained in conjunction with FIGS. 10A to 10D. FIG. 10A is a schematic plan view of the sensor cell 11 and the wiring line SIG in the photoelectric conversion device of high S/N (signal-to-noise) ratio or high resolution. Besides, FIG. 10B is a schematic sectional view taken along dot-and-dash line 10B—10B indicated in FIG. 10A. Further, FIGS. 10C and 10D are a schematic plan view and a schematic sectional view showing the state in which the transistor T11 shown in FIGS. 10A and 10B has been vaporized away and removed as the element itself by the laser irradiation.

Incidentally, portions of the same functions as in FIGS. 2A and 2B and 7A and 7B referred to before have the same symbols assigned thereto and shall be omitted from explanation. Also, the constituents of the photoelectric element S11 shown in FIGS. 10B and 10D are the same as in the foregoing and shall be omitted from explanation.

The constructions of each sensor cell etc. in this embodiment differ from those of each sensor cell etc. explained before, as stated below. As understood by comparing FIG. 10A with FIG. 7A, the sensor cell 11 differs in pattern in that the length of the signal wiring line SIG is reduced to enlarge the area of the photoelectric element S11. This structure is intended to manufacture a photoelectric conversion device of higher sensitivity in order that the quantity of exposure to, for example, X-rays may be diminished.

Figure 7A:
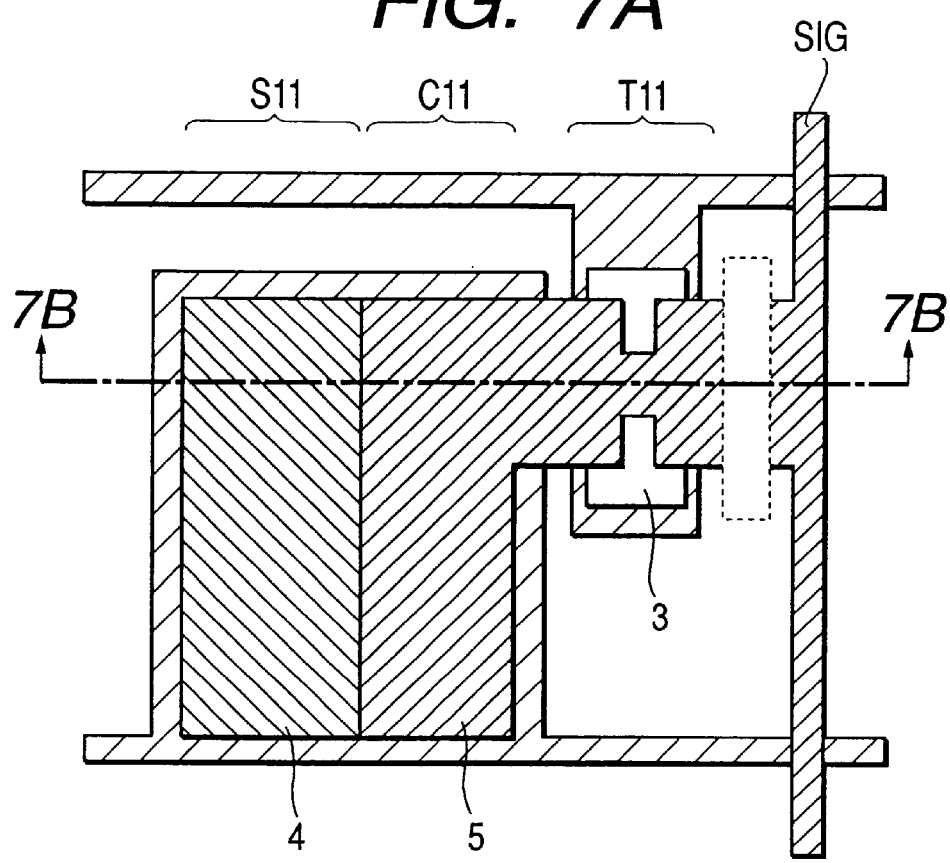
FIGS. 7A and 7B are a schematic plan view and a schematic sectional view showing examples of constituent elements which are included in the photoelectric conversion device shown in FIG. 6, respectively.

As understood by comparing FIG. 10C with FIG. 7A, the sensor cell 11 differs in pattern in that, as in the comparison of FIG. 10A with FIG. 7A, the length of the signal wiring line SIG is reduced to enlarge the area of the photoelectric element S11. As a further difference, the signal wiring line SIG connected with the defective sensor cell 11 has been partially vaporized away to disconnect in the case of FIG. 7A, whereas the transistor T11 as the whole element has been vaporized away and removed in the case of FIG. 10C.

Figure 7B:
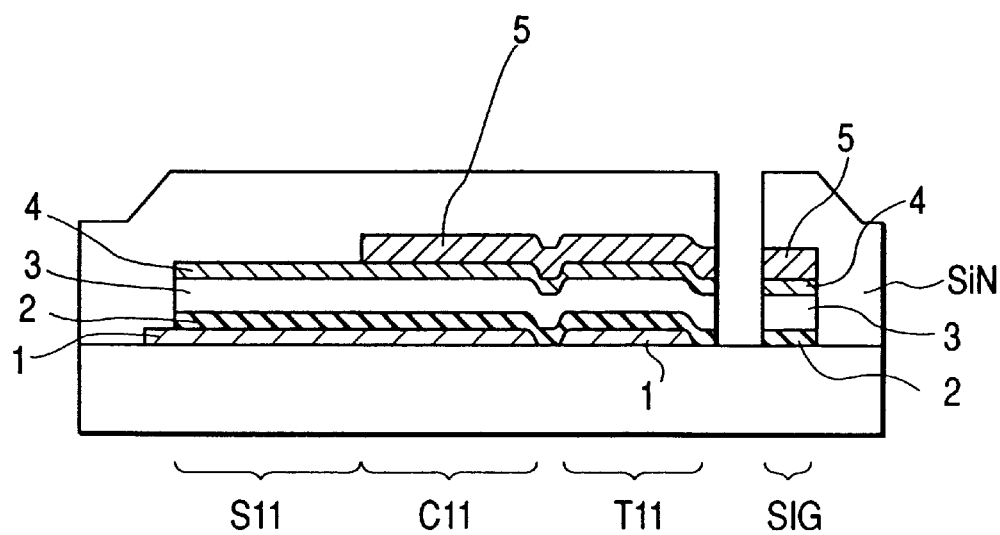

More specifically, FIGS. 7A and 7B correspond to the situation where the signal wiring lines SIG connected with the defective sensor cells 11 and 22 in FIG. 4 have been partially vaporized away to disconnect by the laser irradiation. In contrast, FIGS. 10C and 10D correspond to the situation where the transistors T included in the defective sensor cells 11 and 22 assumed in this embodiment have been vaporized away to electrically disconnect by the laser irradiation.

In this embodiment, the signal wiring lines SIG connected with the defective sensor cells cannot be vaporized away to disconnect by the laser irradiation, for the reason stated before. Therefore, the defective transistors T are vaporized away by the laser irradiation, thereby to disconnect the defective sensor cells from the signal wiring lines SIG. Thus, the outputs of the sensor cells except the defective ones can be made to have the normal values.

That is, in the photoelectric conversion device shown in FIG. 9, the transistor T11 of the sensor cell 11 and the transistor T22 of the sensor cell 22 have been entirely vaporized away and removed by the laser irradiation, and these sensor cells and the signal wiring lines SIG have been disconnected. Concretely, the transistor T11 has been removed as best shown in FIG. 10D.

FIG. 10D illustrates the sectional structure of a portion where the transistor T11 has been disconnected. As seen from the figure, not only the whole transistor T11, but also the passivating silicon nitride layer SiN, and the gate insulator film 2, i-layer 3 and n-layer 4 underlying the signal wiring line SIG have been partially vaporized away by the laser irradiation.

Figure 8:
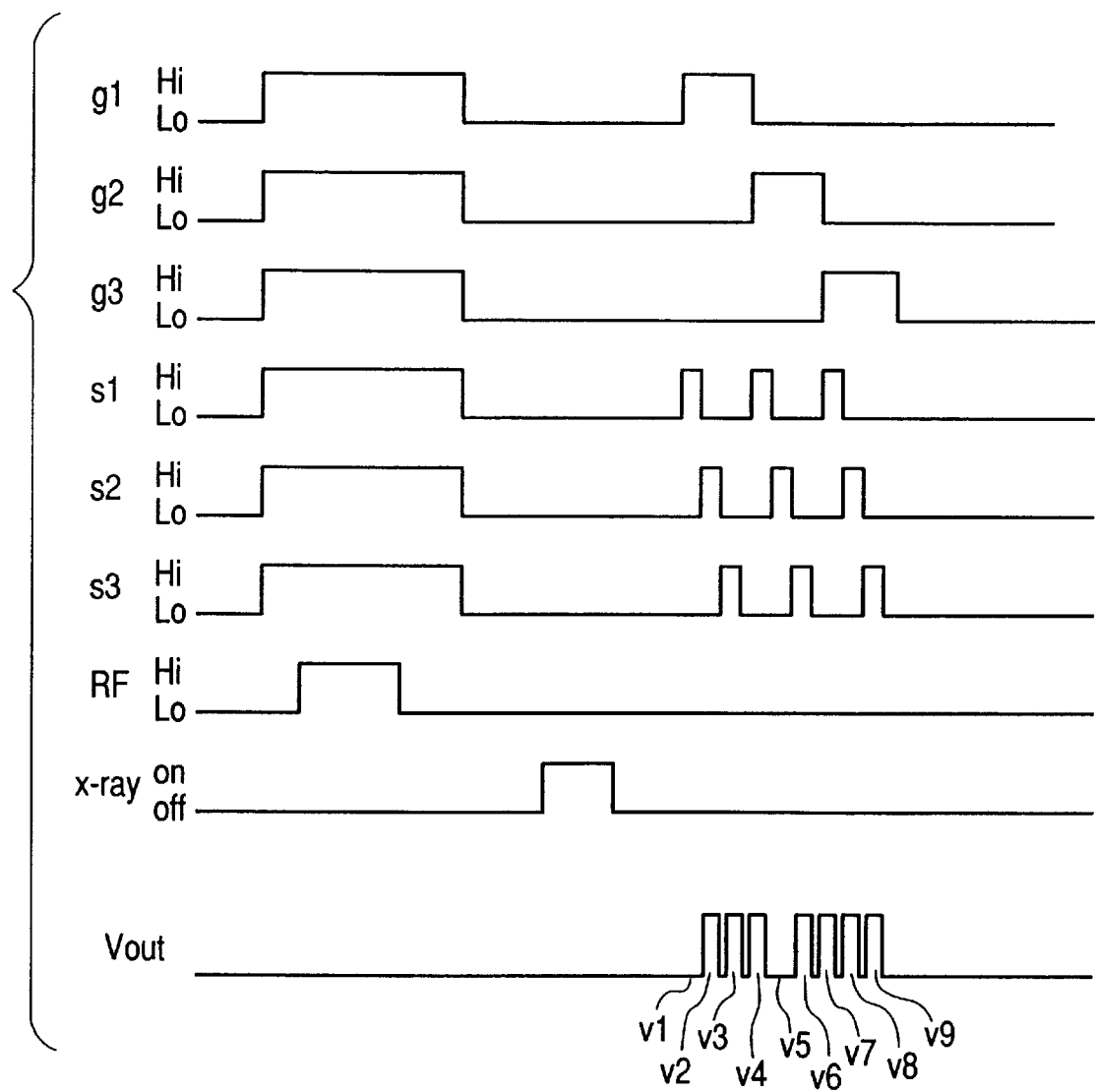
FIG. 8 is a timing chart showing examples of the operation of the photoelectric conversion device shown in FIG. 6.

Even when the transistor T11 connected with the sensor cell 11 failing to operate normally has been vaporized away to disconnect by the laser irradiation, the output v1 of the photoelectric element S11 does not demonstrate the value in the usual operation. The output v1 of the photoelectric element S11, however, is prevented from being superposed by leakage. Accordingly, the outputs v4 and v7 of the respective photoelectric elements S21 and S31 become as shown in FIG. 8.

Likewise, the defective transistor T22 of the sensor cell 22 has been vaporized away to disconnect by the laser irradiation. Herein, the passivating silicon nitride layer SiN, and the gate insulator film 2, i-layer 3 and n-layer 4 underlying the signal wiring line SIG have been partially vaporized away by the laser irradiation. Even when the defective sensor cell 22 has been vaporized away to disconnect by the laser irradiation, the output v5 of the photoelectric element S22 does not demonstrate the value in the usual operation.

However, the gate line signal of the transistor T22 of the sensor cell 22 is prevented from being superposed by leakage, similarly to the effect in the case where the sensor cell 11 has been treated. Accordingly, the outputs v2 and v8 of the respective photoelectric elements S12 and S32 become as shown in FIG. 8.

Figure 5:
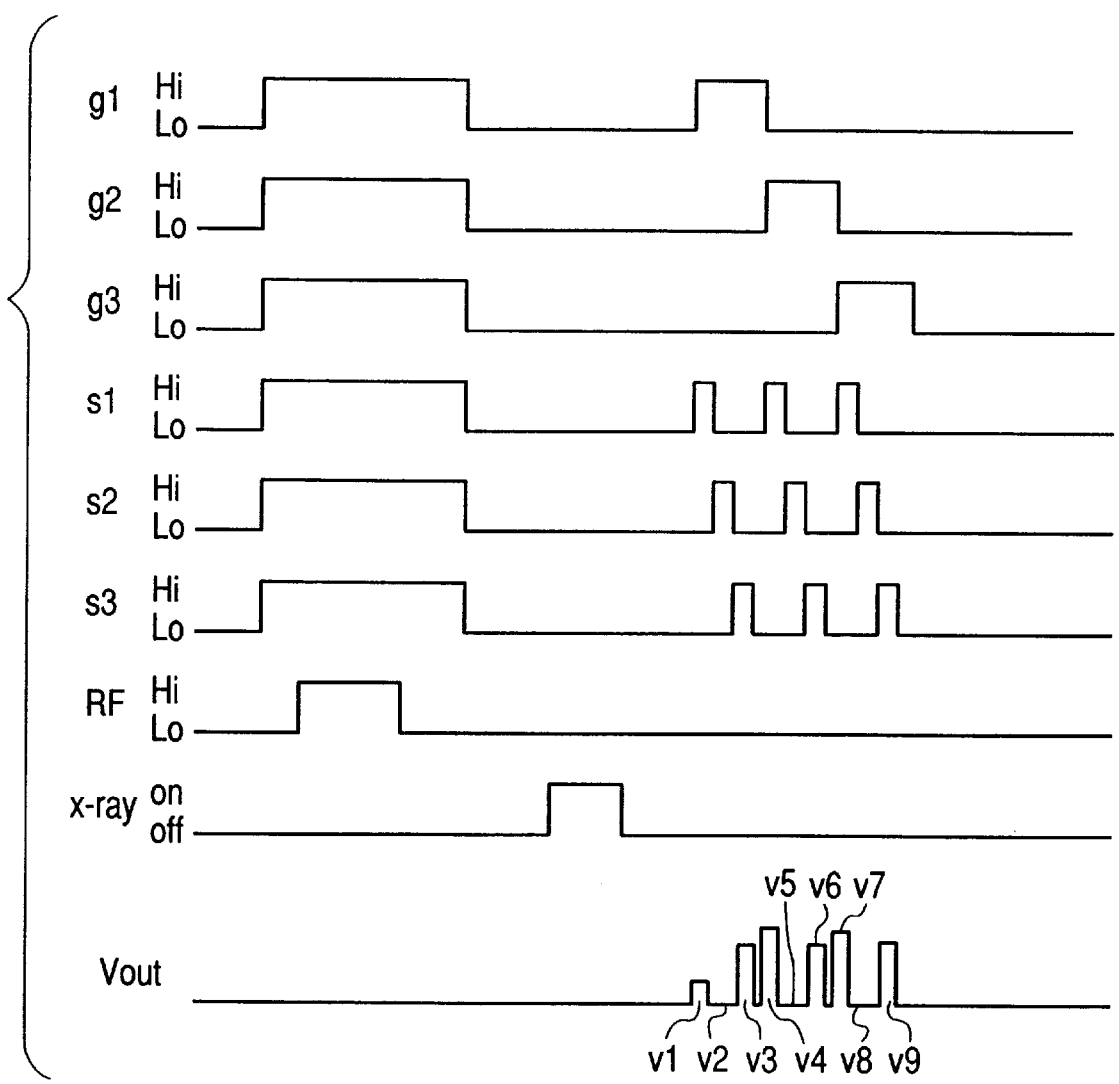
FIG. 5 is a timing chart showing examples of the operation of the photoelectric conversion device shown in FIG. 4.

Further, strictly speaking, unless the treatment is carried out, the amplitudes of the output signals of the sensor cells, except the outputs v1 and v5 of the respective photoelectric elements S11 and S22, become larger than the amplitudes of the output signals shown in FIG. 5. The reason therefor is that the photoelectric elements S of the photoelectric conversion device in this embodiment are larger in area than the photoelectric elements S of the photoelectric conversion device shown in FIG. 1.

Next, examples of the packaging of a photoelectric conversion device having 2000×2000 sensor cells will be explained in conjunction with FIGS. 11 and 12. These figures are plan views each showing the packaging of the photoelectric conversion device having 2000× 2000 sensor cells. In case of constructing the 2000×2000 detectors, the number of the constituent elements within a larger square of broken line indicated in FIG. 9 may be increased in both the vertical and horizontal directions of the figure. In this case, however, the control wiring lines g increase to 2000 lines consisting of g1 to g2000. Also, the signal wiring lines SIG increase to 2000 lines consisting of sig1 to sig2000.

Further, each of the shift register SR1 and detecting integrated circuit IC must control and process the 2000 lines and enlarges in scale. When it is fabricated as an element of one chip, the chip becomes very large, which is demeritorious in the points of available percentage in the fabrication, the price of the element, etc.

Therefore, the shift register (SR1) 10 is so fabricated that every 100 stages, for example, are formed on one chip, thereby to construct twenty shift registers (SR1-1 to SR1-20). Also, the detecting integrated circuit (IC) 13 is so fabricated that every 100 processing circuits are formed on one chip, thereby to construct twenty detecting integrated circuits (IC1 to IC20).

Figure 11:
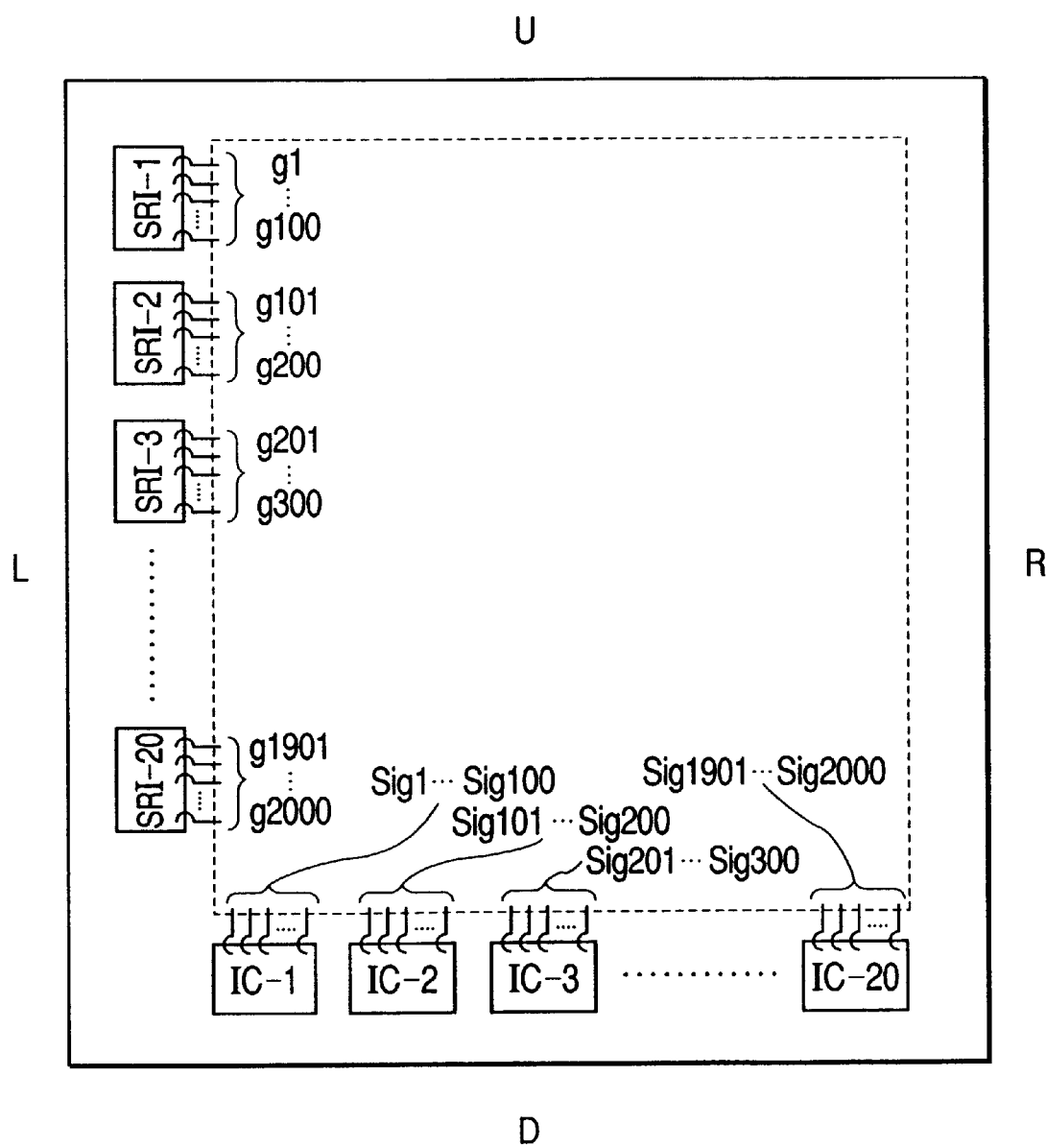
FIGS. 11 and 12 are schematic plan views each showing an example of the packaging of the photoelectric conversion device shown in FIG. 9.

In the example of FIG. 11, twenty chips (SR1-1 to SR1-20) are packaged on the left side (L) of the photoelectric conversion device, and twenty chips (IC1 to IC20) on the lower side (D). The control wiring lines g and signal wiring lines SIG in the numbers of 100 per chip are connected with the corresponding chips by wire bonding. In FIG. 11, a square part of broken line corresponds to the larger square indicated by the broken line in FIG. 9. By the way, the outward connections of the chips totaling forty are omitted from illustration. Also, the constituent elements of the device, such as SWg, SWs, Vg, Vs and RF, are omitted from illustration.

Twenty outputs (Vout) are derived from the detecting integrated circuits IC1 to IC20. They may be serialized through switches etc., or may well be directly delivered so as to be processed in parallel.

Figure 12:
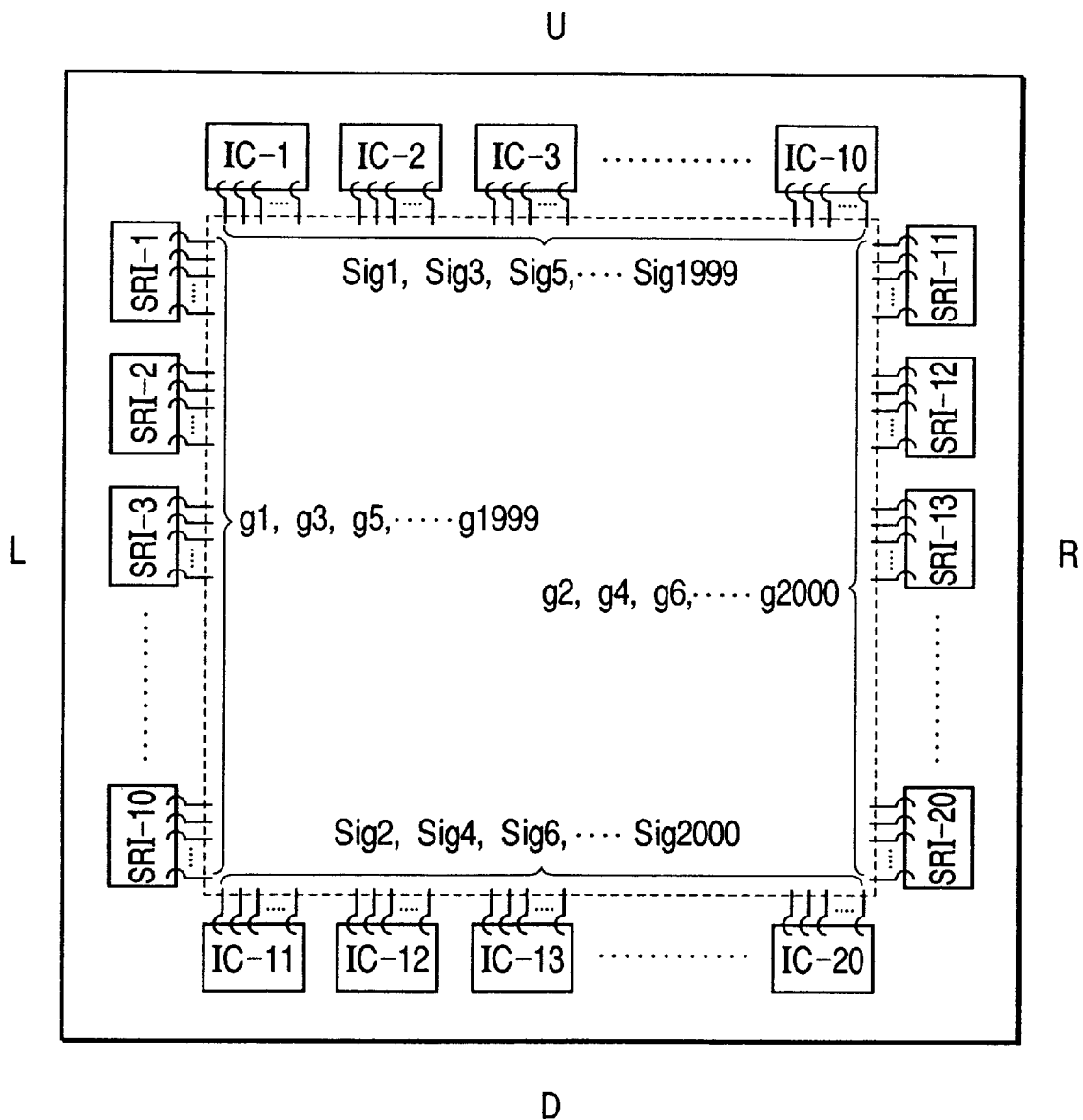

On the other hand, in the example of FIG. 12, ten chips (SR1-1 to SR1-10) are packaged on the left side (L) of the photoelectric conversion device, ten chips (SR1-11 to SR1-20) on the right side (R), ten chips (IC1 to IC10) on the upper side (U), and ten chips (IC11 to IC20) on the lower side (D).

In this configuration, 1000 wiring lines are distributed to each of the upper, lower, left and right sides (U, D, L and R). Therefore, the density of wiring lines at each side lowers. Also, the density of wire pieces for wire bonding at each side is lower. Accordingly, the available percentage of the articles of the photoelectric conversion device is enhanced. The control wiring lines g1, g3, g5, . . . , g1999 are distributed to the left side (L), while those g2, g4, g6, . . . , g2000 are distributed to the right side (R). That is, the odd-numbered control wiring lines are distributed to the left side (L), and the even-numbered control wiring lines to the right side (R). With such distributions, the wiring lines are led out and laid at equal intervals. Therefore, the wiring lines are not concentrated, and the available percentage is enhanced. The wiring lines on the upper side (U) and lower side (D) are similarly distributed.

Each of the examples of the photoelectric conversion device shown in FIGS. 11 and 12 may well be manufactured by forming the circuitry of the broken-line part on one substrate and thereafter mounting the chips on the substrate.

According to this embodiment, the photoelectric conversion device of large area and high performance can be manufactured by a simple manufacturing process. That is, since the elements of the photoelectric conversion device are simultaneously formed using the common films or layers, the number of steps of the manufacturing process is small. Owing to the simple manufacturing process, the articles of the device can be manufactured at high available percentage. Therefore, the production of the photoelectric conversion device of large area and high performance is permitted at low cost. Besides, the capacitor C and the photoelectric element S can be formed in the identical sensor cell, and the number of elements can be reduced to half in substance, so that the available percentage can be enhanced more.

EMBODIMENT 2

Now, this embodiment will be described concerning a case where a photoelectric conversion device is applied to an X-ray imaging apparatus.

Figure 13A:
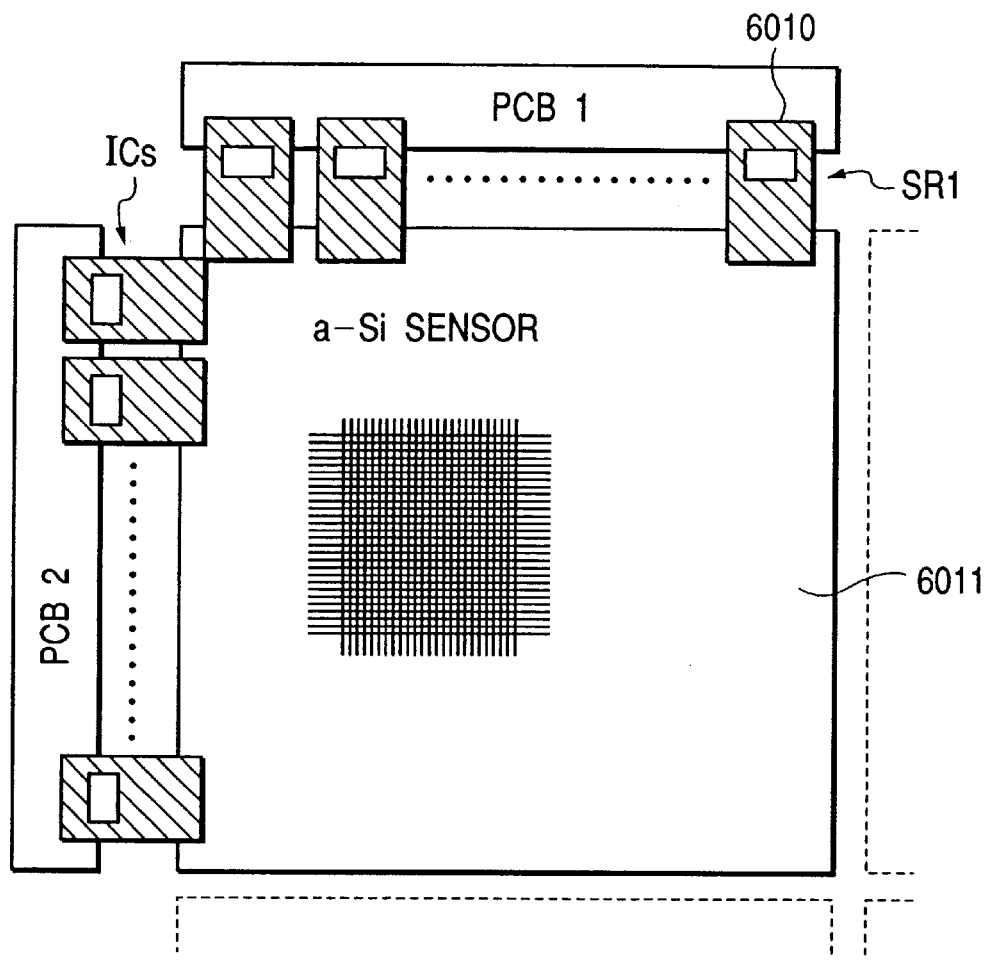
FIGS. 13A and 13B are a schematic plan view and a schematic sectional view showing an example of the photoelectric conversion portion of an X-ray imaging apparatus which includes the photoelectric conversion device shown in FIG. 9.
Figure 13B:
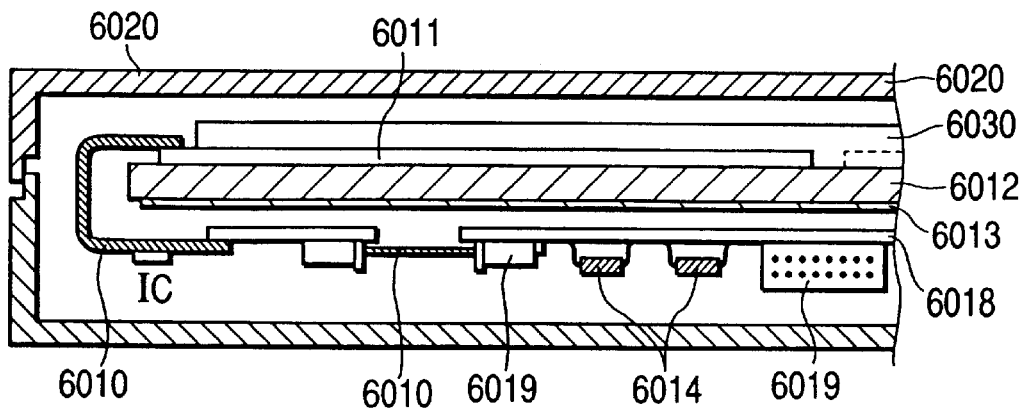

FIGS. 13A and 13B are a schematic plan view and a schematic sectional view of the X-ray imaging apparatus which includes the photoelectric conversion device explained in Embodiment 1. The X-ray imaging apparatus is constructed as described below. A plurality of photoelectric elements and transistors are formed in an a-Si sensor substrate 6011. Besides, flexible circuit boards 6010 in which the shift register SR1 and the detecting integrated circuit IC are packaged are connected to the substrate 6011.

The sides of the flexible circuit boards 6010 opposite to the substrate 6011 are connected to printed circuit boards PCB1 and PCB2. A plurality of a-Si sensor substrates 6011 as stated above are bonded on a base 6012. The base 6012 for constructing the photoelectric conversion device of large size is underlaid with a lead plate 6013 for protecting memories 6014 in a processing circuit 6018 from X-rays.

A phosphor 6030, for example, CsI (cesium iodide) for converting the X-rays into visible radiation or light is deposited on the a-Si sensor substrate 6011 by coating or sticking. The X-rays are detected using the photoelectric conversion device explained with reference to FIG. 9. In this embodiment, the device is entirely received in a case 6020 made of carbon fiber as shown in FIG. 13B.

Figure 14:
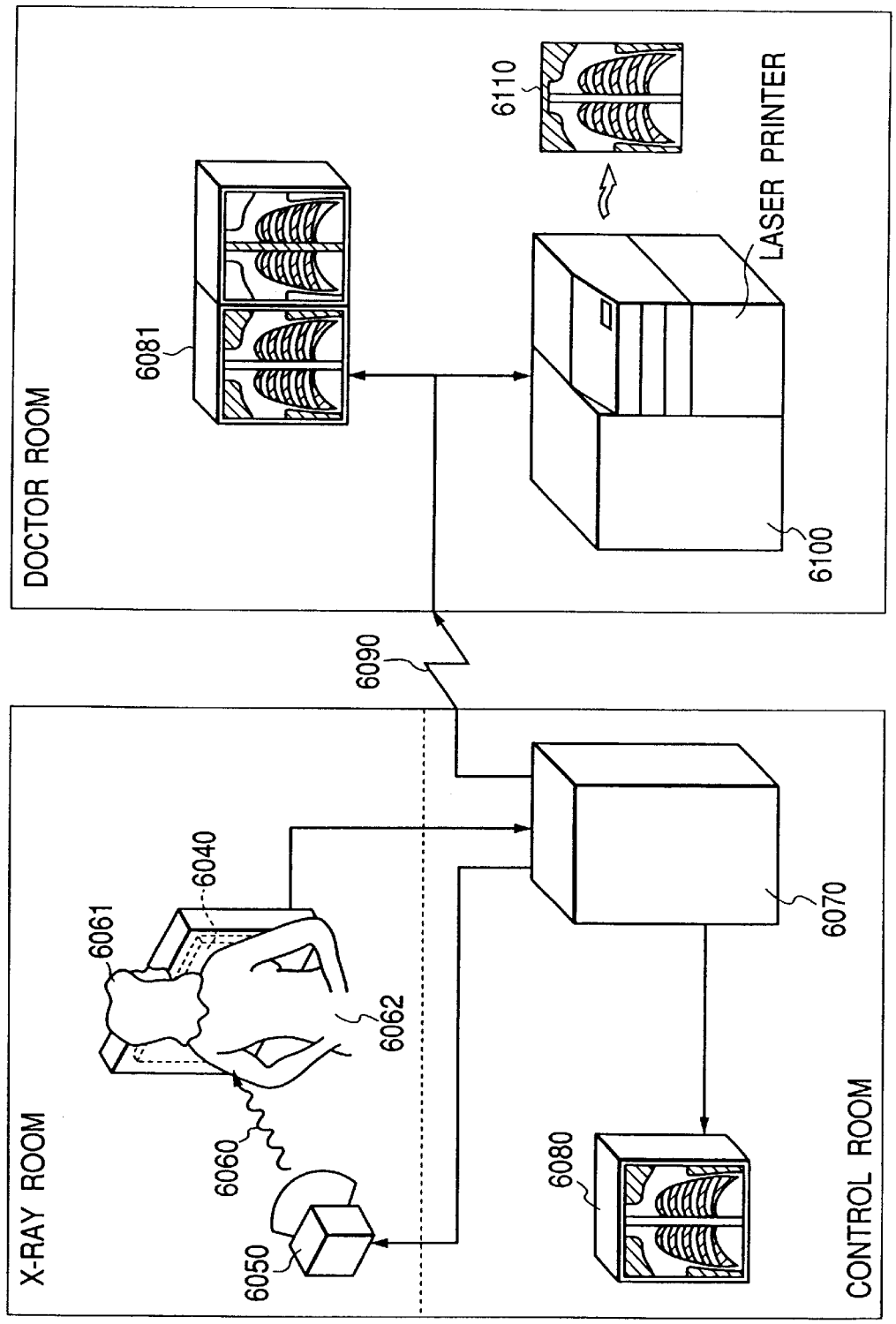
FIG. 14 is a schematic architectural view for explaining an example of an X-ray diagnosis system which includes the photoelectric conversion device shown in FIG. 9.

FIG. 14 illustrates an example of application of the photoelectric conversion device of the present invention to an X-ray diagnosis system.

X-rays 6060 generated by an X-ray tube 6050 are transmitted through the chest 6062 of a patient or subject 6061, and are entered into a photoelectric conversion apparatus 6040 including a screen of phosphor. Information on the interior of the body of the patient 6061 is contained in the entered X-rays. The phosphor phosphoresces in correspondence with the entrance of the X-rays, and the resulting phosphorescence is photoelectrically converted to obtain electrical information. The electrical information is digitized and is subsequently processed by an image processor 6070 into an image, which can be observed on a display device 6080 installed in a control room.

Moreover, the image information can be sent to a remote site by transmission (communication) means such as a telephone line 6090. In a doctor room or the like in a place separate from the X-ray room or the control room, the sent information can be displayed on a display device 6081, or it can be saved and stored in save means such as an optical disk. It is accordingly possible to utilize the system for a diagnosis by a doctor in the remote site. Furthermore, the sent information can be recorded on a film 6110 by a film processor 6100.

As thus far described, with a photoelectric conversion device according to the present invention, defective transistors are vaporized away by laser irradiation. That is, irrespective of the patterns of sensor cells, defective sensor cells and signal lines can be disconnected with ease. Accordingly, the outputs of the sensor cells except the defective ones can be made to have usual values. It is therefore possible to manufacture the photoelectric conversion device of high S/N ratio or high resolution.

Besides, the sensor cells can be employed as those of the photoelectric conversion device of large area. Thus, the photoelectric conversion device of large area and high performance can be manufactured at high available percentage by a simple manufacturing process.

Further, a facsimile equipment or X-ray imaging apparatus of large area, high functions and enhanced characteristics can be provided at lower cost by utilizing the photoelectric conversion device having the excellent features as stated above.

What is claimed is:

1. A photoelectric conversion device wherein a plurality of sensor cells, in each of which a photoelectric element and a switching element are connected, are arrayed in two dimensions on a substrate, said switching element of at least one of said sensor cells having been removed.

2. A photoelectric conversion device as defined in claim 1, wherein said switching element controls said photoelectric element through a control wiring line which is connected to each of the rows of said sensor cells, and said photoelectric element transfers signal charges to a signal wiring line which is connected to each of the columns of said sensor cells, whereby the signal charges can be fetched.

3. A photoelectric conversion device as defined in claim 1, wherein said photoelectric element includes a semiconductor layer for photoelectric conversion for generating first and second carriers from entered signal light, a lower electrode layer which forms a gate electrode, and an upper electrode layer which forms a source and drain electrodes; further comprising:

photoelectric conversion means for storing said first carriers in said semiconductor layer for photoelectric conversion by applying an electric field to said photoelectric element and for injecting said second carriers into said upper electrode layer;

refreshment means for injecting said first carriers from said semiconductor layer for photoelectric conversion into said upper electrode layer by applying an electric field to said photoelectric element; and detection means for detecting either of said first carriers stored in said semiconductor layer for photoelectric conversion during the photoelectric conversion operation of said photoelectric conversion means and said second carriers injected into said upper electrode layer during said photoelectric conversion operation.

4. A method of manufacturing a photoelectric conversion device wherein a plurality of sensor cells, in each of which a photoelectric element and a switching element are connected, are arrayed in two dimensions on a substrate, comprising:

the step of vaporizing away any of the switching elements that does not operate normally, by laser irradiation.

5. A method of manufacturing a photoelectric conversion device as defined in claim 4, wherein said photoelectric element includes a semiconductor layer for photoelectric conversion for generating first and second carriers from entered signal light, a lower electrode layer which forms a gate electrode, and an upper electrode layer which forms a source and drain electrodes; further comprising the steps of:

storing said first carriers in said semiconductor layer for photoelectric conversion by applying an electric field to said photoelectric element, and to inject the second carriers into said upper electrode layer;

injecting said first carriers from said semiconductor layer for photoelectric conversion by applying an electric field to said each photoelectric element into said upper electrode layer; and detecting either of said first carriers stored in said semiconductor layer for photoelectric conversion during the photoelectric conversion and said second carriers injected into said upper electrode layer during said photoelectric conversion.

6. An X-ray imaging system, comprising:

a photoelectric conversion device which includes a phosphor for converting inputted X-rays into light;

signal processing means for processing a signal delivered from said photoelectric conversion device;

recording means for recording a signal delivered from said signal processing means;

displaying means for displaying the signal delivered from said signal processing means;

transmission processing means for transmitting said signal delivered from said signal processing means; and an X-ray source which generates the X-rays;

said photoelectric conversion device including a plurality of sensor cells in each of which a photoelectric element and a switching element are connected, which are arrayed in two dimensions on a substrate, and in at least one of which said switching element has been removed.

7. A method of manufacturing a photoelectric conversion device wherein a plurality of sensor cells, each of which has a photoelectric element and a switching element, are arrayed on a substrate, comprising:

the step of selecting any defective cell from among the sensor cells, and thereafter removing the switching element of the defective cell.

8. A method of manufacturing a photoelectric conversion device as defined in claim 7, wherein said switching element is a thin-film transistor.

9. A method of manufacturing a photoelectric conversion device as defined in claim 7, wherein said switching element is removed by irradiation with a laser beam.

10. A radioactive ray imaging system, comprising:

a source for generating radioactive rays;

a plurality of sensor cells provided on a substrate for reading out a signal obtained by receiving the radioactive rays, said plurality of sensor cells each including a switching element for selecting a prescribed sensor cell therefrom;

signal processing means for processing the signal delivered from said sensor cells;

recording means for recording a signal delivered from said signal processing means;

displaying means for displaying the signal delivered from said signal processing means; and transmission processing means for transmitting the signal delivered from said signal processing means, said switching element of at least one of said sensor cells having been removed.

* * * * *